(12) United States Patent
Jang et al.

(10) Patent No.: US 11,121,679 B2
(45) Date of Patent: Sep. 14, 2021

(54) AMPLIFYING APPARATUS WITH IMPROVED LINEARITY

(71) Applicant: SAMSUNG ELECTRO-MECHANICS CO., LTD., Suwon-si (KR)

(72) Inventors: Young Wong Jang, Suwon-si (KR); Byeong Hak Jo, Suwon-si (KR); Jeong Hoon Kim, Suwon-si (KR); Jong Ok Ha, Suwon-si (KR); Hyun Paek, Suwon-si (KR); Shinichi Iizuka, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 63 days.

(21) Appl. No.: 16/452,986

(22) Filed: Jun. 26, 2019

(65) Prior Publication Data
US 2020/0136566 A1   Apr. 30, 2020

(30) Foreign Application Priority Data
Oct. 25, 2018 (KR) .................. 10-2018-0128228

(51) Int. Cl.
| | | |
|---|---|---|
| H03F 3/45 | (2006.01) | |
| H03F 1/30 | (2006.01) | |
| H03F 1/02 | (2006.01) | |
| H03G 3/30 | (2006.01) | |
| H03F 3/21 | (2006.01) | |
| H03F 3/72 | (2006.01) | |
| H03F 3/19 | (2006.01) | |

(52) U.S. Cl.
CPC ............ *H03F 1/30* (2013.01); *H03F 1/0261* (2013.01); *H03F 3/19* (2013.01); *H03F 3/21* (2013.01); *H03F 3/72* (2013.01); *H03G 3/30* (2013.01)

(58) Field of Classification Search
CPC . H03F 1/30; H03F 1/0261; H03F 3/21; H03F 3/72; H03F 3/19; H03F 2200/468; H03F 3/245; H03F 2200/447; H03F 1/32; H03F 1/303; H03F 1/302; H03G 3/30; H03G 3/3042
USPC ................ 330/285, 289, 296, 256, 266, 272
See application file for complete search history.

(56) References Cited

U.S. PATENT DOCUMENTS

| | | | |
|---|---|---|---|
| 6,215,358 B1 * | 4/2001 | Hon ........................ | H03F 1/306 330/289 |
| 9,628,029 B2 | 4/2017 | Huang et al. | |
| 2013/0034144 A1 | 2/2013 | Doherty et al. | |
| 2013/0293311 A1 * | 11/2013 | Wakita .................... | H03F 3/245 330/296 |

\* cited by examiner

*Primary Examiner* — Khanh V Nguyen
*Assistant Examiner* — Khiem D Nguyen
(74) *Attorney, Agent, or Firm* — NSIP Law

(57) ABSTRACT

An amplifying apparatus is provided. The amplifying apparatus comprises an amplifying circuit comprising a power amplifier and a bias circuit, the bias circuit is configured to detect an ambient temperature of the power amplifier to output a temperature voltage and regulate an internal current based on an input control signal to supply a bias current obtained by the regulation to the power amplifier; and a temperature control circuit that generates the control signal based on the temperature voltage during initial driving from a transmission mode starting point in time to an input point in time at which an input signal is input and outputting the control signal to the amplifying circuit.

16 Claims, 9 Drawing Sheets

AMPLIFYING APPARATUS WITH IMPROVED LINEARITY

CROSS-REFERENCE TO RELATED APPLICATION(S)

This application claims the benefit under 35 USC § 119(a) of Korean Patent Application No. 10-2018-0128228 filed on Oct. 25, 2018 in the Korean Intellectual Property Office, the entire disclosure of which is incorporated herein by reference for all purposes.

BACKGROUND

1. Field

This application relates to an amplifying apparatus with improved linearity.

2. Description of Related Art

There is an increasing trend toward frequency utilization based on a time division duplexing (TDD) carrier or spectrum in order to improve the compatibility of TDD with 5th generation (5G) communications, and to form a mobile ecosystem in a situation in which available frequencies are gradually decreased.

Although the TDD method is advantageous in that one frequency is used, since communications are performed by allocating different transmission time slots, transmission and reception may be repeatedly switched during a communication process.

Meanwhile, linearity in a transmitter is an important performance index. In a frequency division duplex (FDD) system, an adjacent channel leakage ratio (ACLR) may be the most important parameter for the linearity, and in a TDD system, dynamic error vector magnitude (EVM) considering time is important.

In a typical communication system that implements the TDD method, as a transmission mode is turned on and a power amplifier (PA) reaches a saturation region, and as a temperature of the power amplifier (PA) is increased, a gain is gradually changed, which results in a decrease in linearity.

In order to reduce the DEVM as an index of the linearity of the communication system which implements the TDD method, it may be advantageous to perform a control so that the temperature and the gain of the power amplifier become constant by making the power amplifier (PA) reach the saturation region as speedily as possible once the transmission mode starts.

Since the power amplifier reaches the saturation region after a certain time once the transmission mode starts, and, when reaching the saturation region, the power amplifier reaches a certain temperature or higher, it may be beneficial for an amplifying apparatus applied to the communication system that implements the TDD method to make the power amplifier rapidly reach the saturation region based on temperature information of the power amplifier.

However, the amplifying apparatus of the typical communication system implementing the TDD method may not provide a function of controlling a warm-up of the power amplifier to allow the power amplifier to rapidly reach the saturation region on the basis of temperature information, and thus may not perform an appropriate temperature-based control for allowing the power amplifier to rapidly reach the saturation region.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an amplifying apparatus includes an amplifying circuit comprising a power amplifier, a bias circuit, and a temperature control circuit, wherein the bias circuit is configured to detect an ambient temperature of the power amplifier, output a temperature voltage based on the detection of the ambient temperature, regulate an internal current based on an input control signal, and supply a bias current obtained by the regulation of the internal current to the power amplifier; and the temperature control circuit is configured to generate the control signal based on the temperature voltage during an initial driving from a transmission mode starting point in time to an input point in time at which an input signal is input, and outputting the control signal to the amplifying circuit.

The bias circuit may include a temperature detection circuit configured to detect the ambient temperature of the power amplifier to output the temperature voltage.

The temperature control circuit may include a temperature voltage converter configured to convert the temperature voltage into a detection voltage, a comparison circuit configured to compare the detection voltage and a reference voltage with each other and output a comparison signal that has a level that is based on a result of the comparison, a signal detection circuit configured to detect an intensity of the input signal and output a detection signal, and a control output circuit configured to generate the control signal based on the detection signal and the comparison signal.

The control output circuit may include a logic circuit configured to generate the control signal by performing a logic operation on the detection signal and the comparison signal.

The control output circuit may include a switching circuit that is configured to turn on or turn off based on the detection signal, and provide the comparison signal as the control signal when the switching circuit is turned on.

The bias circuit may include a temperature detection circuit comprising a transistor circuit configured to receive a reference current to detect the ambient temperature of the power amplifier and generate a temperature detection voltage, a current output circuit configured to generate an internal current based on the temperature detection voltage, and a current addition circuit configured to generate an additional current based on the control signal during the initial driving, and generate the bias current by adding the additional current to the internal current.

The bias circuit further may include a switch that is connected between the temperature detection circuit and a ground, and is configured to turn off during the initial driving.

The bias circuit may include a current addition circuit configured to generate an additional current in based on the control signal during the initial driving and add the additional current to a reference current, a temperature detection circuit comprising a transistor circuit configured to receive the internal current to detect the ambient temperature of the power amplifier, and generate a temperature detection voltage, and a current output circuit configured to generate a bias current based on the temperature detection voltage.

In a general aspect, an amplifying apparatus includes an amplifying circuit comprising a power amplifier, a temperature detection circuit, and a bias circuit, wherein the temperature detection circuit is configured to detect an ambient temperature of the power amplifier to output a temperature voltage, and the bias circuit is configured to regulate an internal current based on an input control signal to supply a bias current obtained by the regulation to the power amplifier; and a temperature control circuit configured to generate the control signal based on the temperature voltage during an initial driving from a transmission mode starting point in time to an input point in time at which an input signal is input, and output the control signal to the amplifying circuit.

The temperature control circuit may include a temperature voltage converter configured to convert the temperature voltage into a detection voltage, a comparison circuit configured to compare the detection voltage and a reference voltage with each other and output a comparison signal that has a level that is based on a result of the comparison result, a signal detection circuit configured to detect an intensity of the input signal and output a detection signal, and a control output circuit configured to generate the control signal based on the detection signal and the comparison signal.

The control output circuit may include a logic circuit configured to generate the control signal by performing a logic operation on the detection signal and the comparison signal.

The control output circuit may include a switching circuit configured to turn on or turn off based on the detection signal and provide the comparison signal as the control signal when the switching circuit is turned on.

The temperature detection circuit may include a resistor and a transistor connected to each other in series between an operating voltage terminal and a ground, and the transistor is a diode-connected bipolar junction transistor (BJT).

The bias circuit may include a temperature compensation circuit configured to generate a temperature compensation voltage based on a reference current, a current output circuit configured to generate an internal current based on the temperature compensation voltage, and a current addition circuit configured to generate an additional current based on the control signal during the initial driving, and generate the bias current by adding the additional current to the internal current.

The bias circuit may further include a switch connected between the temperature compensation circuit and a ground and configured to turn off during the initial driving. The bias circuit may include a current addition circuit configured to generate an additional current based on the control signal during the initial driving, and generate an internal current by adding the additional current to a reference current, a temperature compensation circuit configured to generate a temperature compensation voltage based on the internal current, and a current output circuit configured to generate a bias current based on the temperature compensation voltage from the temperature compensation circuit.

Other features and aspects will be apparent from the following detailed description, the drawings, and the claims.

Figure 1:
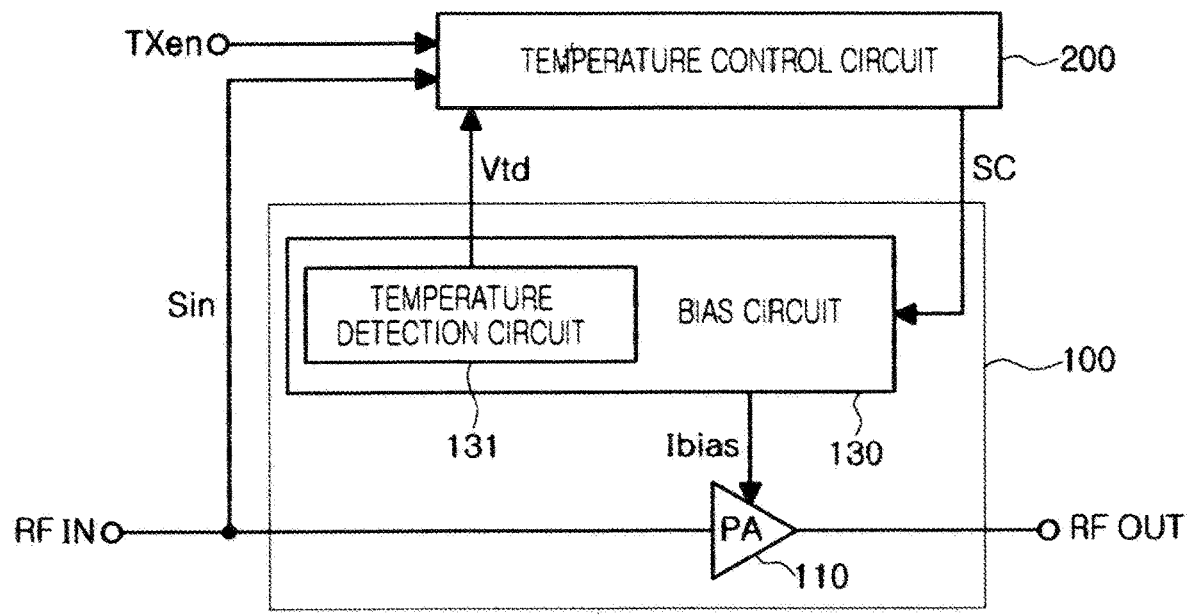
FIG. 1 is a diagram illustrating an example of an amplifying apparatus in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Additionally, in the description of examples, like reference numerals refer to like elements throughout the disclosure of this application, and repeated description related thereto is omitted. Further, detailed description of well-known related structures or functions will be omitted when it is deemed that such description will cause ambiguous interpretation of the present disclosure.

FIG. 1 is a diagram illustrating an example of an amplifying apparatus in accordance with one or more embodiments.

Referring to FIG. 1, an amplifying apparatus may include an amplifying circuit 100 and a temperature control circuit 200.

In a non-limiting example, the amplifying circuit 100 may include a power amplifier 110 and a bias circuit 130.

In an example, the power amplifier 110 may receive a bias current $I_{bias}$ from the bias circuit 130 in a saturation region to amplify a signal input through an input terminal RFIN, and output the amplified signal through an output terminal RFOUT. Accordingly, the power amplifier 110 may have to rapidly reach the saturation region once a transmission mode starts in order for the power amplifier 110 to perform an amplifying operation.

For example, the bias circuit 130 may detect an ambient temperature of the power amplifier (PA) and output a temperature voltage $V_{td}$, and may regulate an internal current lint in response to an input control signal SC generated by, and transmitted from, the temperature control circuit 200 to supply a bias current $I_{bias}$ obtained by the regulation to the power amplifier 110.

For example, the temperature control circuit 200 may generate the control signal SC based on the temperature voltage $V_{td}$ and output the control signal SC to the amplifying circuit 100 during an initial driving from a transmission mode starting point in time based on a transmission mode enable signal $TX_{en}$ to an input point in time at which an input signal $S_{in}$ is input.

For example, the bias circuit 130 may include a temperature detection circuit 131. The temperature detection circuit 131 may detect an ambient temperature of the power amplifier (PA) and output the temperature voltage Vtd.

In the respective drawings in the present disclosure, an unnecessary overlapping description for components denoted by the same reference numerals and having the same functions will be omitted, and contents different from each other in the respective drawings will be described.

Figure 2:
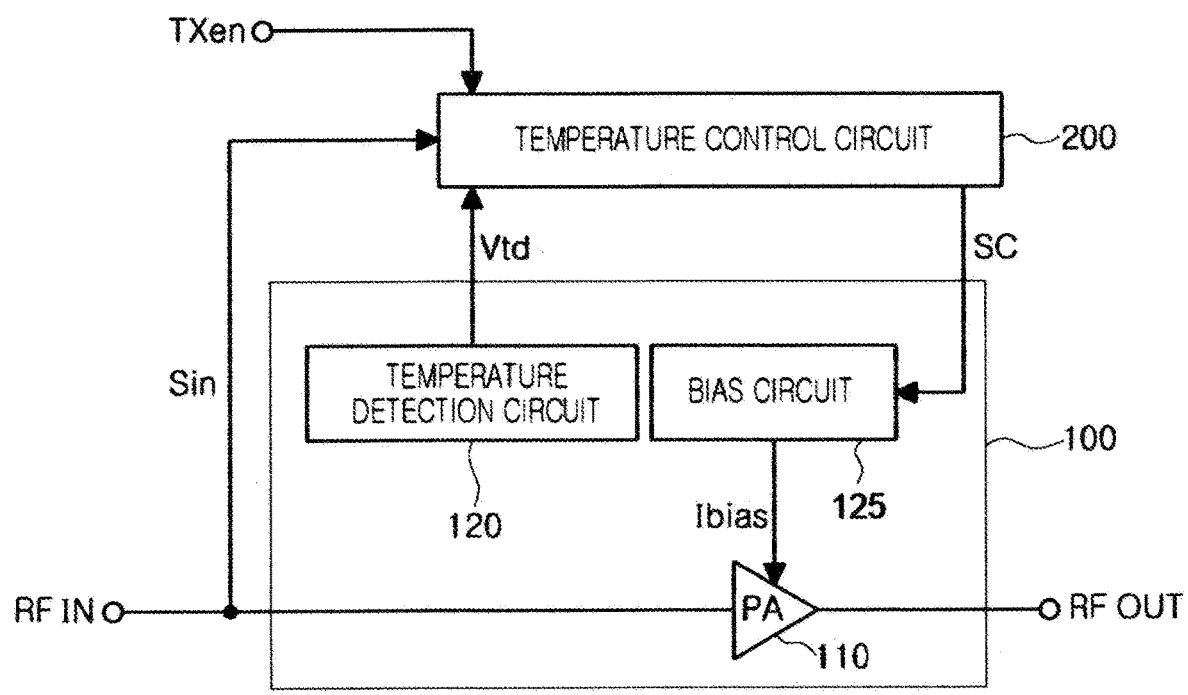
FIG. 2 is a diagram illustrating an example of an amplifying apparatus in accordance with one or more embodiments.

FIG. 2 is a diagram illustrating an example of an amplifying apparatus in accordance with one or more embodiments.

Referring to FIG. 2, an amplifying apparatus may include an amplifying circuit 100 and a temperature control circuit 200.

The amplifying circuit 100 may include a power amplifier 110, a temperature detection circuit 120, and a bias circuit 125.

The temperature detection circuit 120 may detect an ambient temperature of the power amplifier (PA) and output a temperature voltage $V_{td}$. The bias circuit 125 may regulate an internal current lint in response to an input control signal SC and supply a bias current $I_{bias}$ obtained by the regulation to the power amplifier 110.

The temperature control circuit 200 may generate the control signal SC on the basis of the temperature voltage $V_{td}$ and output the control signal SC to the amplifying circuit 100 during initial driving from a transmission mode starting point in time based on a transmission mode enable signal $TX_{en}$ to an input point in time at which an input signal $S_{in}$ is input.

Figure 3:
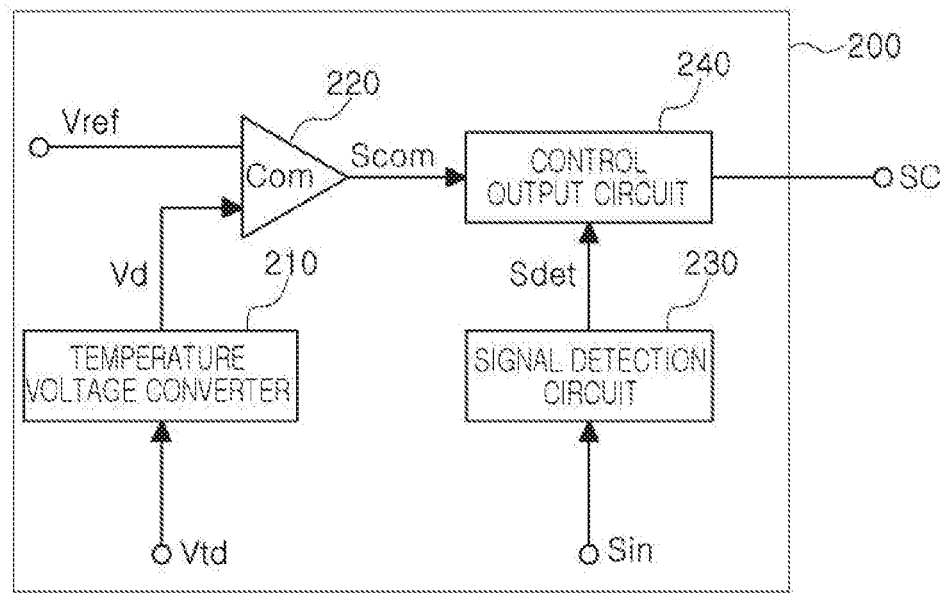
FIG. 3 is a diagram illustrating an example of a temperature control circuit in accordance with one or more embodiments.

FIG. 3 is a diagram illustrating an example of a temperature control circuit in accordance with one or more embodiments.

Referring to FIG. 3, the temperature control circuit 200 may include a temperature voltage converter 210, a comparison circuit 220, a signal detection circuit 230, and a control output circuit 240.

The temperature voltage converter 210 may convert the temperature voltage $V_{td}$ into a detection voltage $V_d$. For example, the temperature voltage converter 210 may include an amplifying circuit, and the amplifying circuit may amplify the temperature voltage $V_{td}$ and output the detection voltage $V_d$ obtained by the amplification.

The comparison circuit 220 may compare the detection voltage $V_d$ and a reference voltage $V_{ref}$ with each other and output a comparison signal $S_{com}$ having a level according to a comparison result. For example, the comparison circuit 220 may output a comparison signal $S_{com}$ having a high level when the detection voltage $V_d$ is higher than the reference voltage $V_{ref}$, and may output a comparison signal $S_{com}$ having a low level when the detection voltage $V_d$ is lower than the reference voltage $V_{ref}$.

In an example, the signal detection circuit 230 may detect an intensity of the input signal $S_{in}$ and output a detection signal $S_{det}$ to the control output circuit 240.

The control output circuit 240 may generate the control signal SC on the basis of the detection signal Sdet and the comparison signal Scom. The control output circuit 240 will be described with reference to FIGS. 4 and 5.

Figure 4:
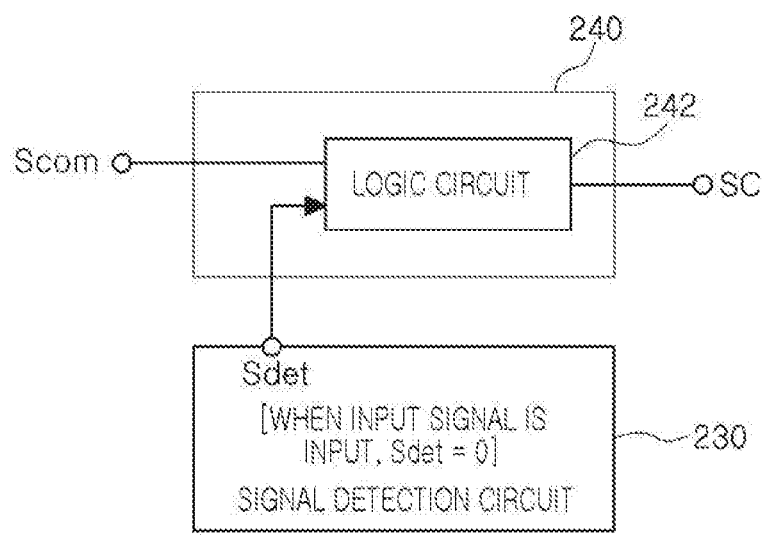
FIG. 4 is a diagram illustrating an example of a control output circuit of FIG. 3.

FIG. 4 is a diagram illustrating an example of the control output circuit 240 of FIG. 3.

Referring to FIG. 4, for example, the control output circuit 240 may include a logic circuit 242. The logic circuit 242 may generate the control signal SC by performing a logic operation on the detection signal $S_{det}$ and the comparison signal $S_{com}$.

For example, the logic circuit 242 may be implemented by at least one of an AND gate, an OR gate, and an inverter, or a combination thereof, in order to output a desired control signal SC.

For example, in an example in which the detection voltage $V_d$ is lower than the reference voltage $V_{ref}$, the comparison signal $S_{com}$ may have a high level, in an example in which the input signal $S_{in}$ is not input, the detection signal $S_{det}$ may have a high level, in an example in which the input signal $S_{in}$ is input, the detection signal $S_{det}$ may have a low level, and the logic circuit 242 may include the AND gate.

The AND gate may provide a control signal SC having a switching-on level (for example, a high level) in an example in which the comparison signal $S_{com}$ has a high level and the detection signal $S_{det}$ has a high level because the input signal $S_{in}$ is not input. On the contrary, the AND gate may provide a control signal SC having a switching-off level (for example, a low level) in an example in which the comparison signal $S_{com}$ has a low level and the detection signal $S_{det}$ has a low level because the input signal $S_{in}$ is input.

Figure 5:
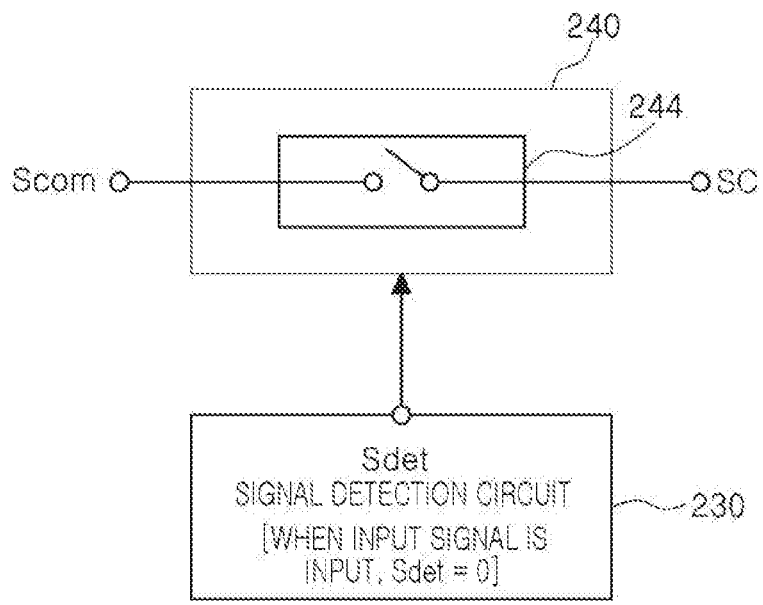
FIG. 5 is a diagram illustrating an example of a control output circuit of FIG. 3.

FIG. 5 is a diagram illustrating an example of the control output circuit 240 of FIG. 3.

Referring to FIG. 5, in an example, the control output circuit 240 may include a switching circuit 244. The switching circuit 244 may be turned on or off according to the detection signal $S_{det}$. In an example in which the switching circuit 244 is turned on in response to the detection signal $S_{det}$, the comparison signal $S_{com}$ may be provided as the control signal SC, in an example in which the switching circuit 244 is turned off, the comparison signal $S_{com}$ may not be output and a control signal SC having a switching-off level may be output.

Various implementations of the amplifying circuit 100 will be described with reference to FIGS. 6 through 11. Overlapping description thereof will be omitted.

Figure 6:
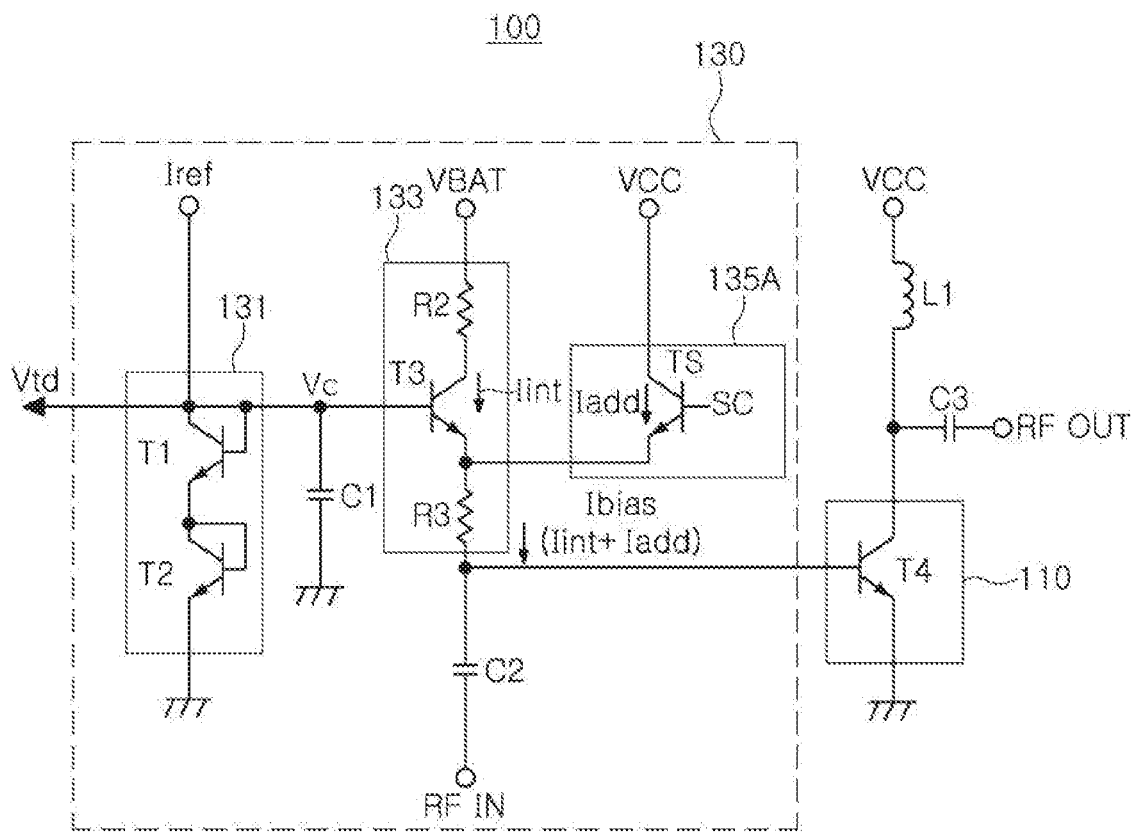
FIG. 6 is a diagram illustrating an example of an amplifying circuit of FIG. 1.

FIG. 6 is a diagram illustrating an example of the amplifying circuit of FIG. 1.

Referring to FIG. 6, the amplifying circuit 100 may include the power amplifier 110 and the bias circuit 130.

In a non-limiting example, the bias circuit 130 may include the temperature detection circuit 131, a current output circuit 133, and a current addition circuit 135A.

The temperature detection circuit 131 may include, for example, transistor circuits T1 and T2 diode-connected to each other in series between a reference current Iref terminal and a ground. The transistor circuits T1 and T2 may receive a reference current $I_{ref}$ and detect an ambient temperature of the power amplifier 110 and generate a temperature detection voltage $V_{td}$.

In an example, a capacitor C1 may be connected between an output terminal of the temperature detection circuit 131 and a ground in order to stabilize an output voltage of the temperature detection circuit 131.

The current output circuit 133 may include, for example, a bias transistor T3 including a base that receives the temperature detection voltage $V_{td}$ from the diode-connected transistor circuits T1 and T2, a collector connected to a battery voltage VBAT terminal through a resistor R2, and an emitter that supplies a bias current to a signal line through a bias resistor R3. The bias transistor T3 may generate an internal current $I_{int}$ based on the temperature detection voltage $V_{td}$ from the temperature detection circuit 131.

The current addition circuit 135A may include, for example, a compensation transistor TS including a collector connected to a power supply voltage VCC terminal, a base receiving the control signal SC, and an emitter connected to the emitter of the bias transistor T3. The compensation transistor TS may be turned on in response to the control signal SC during initial driving to generate an additional current law and provide the generated additional current $I_{add}$ to the emitter of the bias transistor T3. Accordingly, the additional current $I_{add}$ may be added to the internal current Iint to generate a bias current Ibias.

In addition, the power amplifier 110 may include an amplifying transistor T4 including a collector which is connected to the power supply voltage VCC terminal through a coil L1, and connected to the output terminal RFOUT through a capacitor C3, a base which is connected to the input terminal RFIN through a capacitor C2, and connected to the emitter of the bias transistor T3 through the bias resistor R3, and the emitter of the amplifying transistor T4 is grounded. The amplifying transistor T4 may receive the bias current $I_{bias}$, amplify a signal input through the input terminal RFIN, and output the amplified signal through the output terminal RFOUT connected through the capacitor C3.

The power amplifier 110 illustrated in FIG. 6 may have the same structure and function as the structure and function of the power amplifier of FIGS. 7 through 11, and thus an overlapping description will be omitted.

Figure 7:
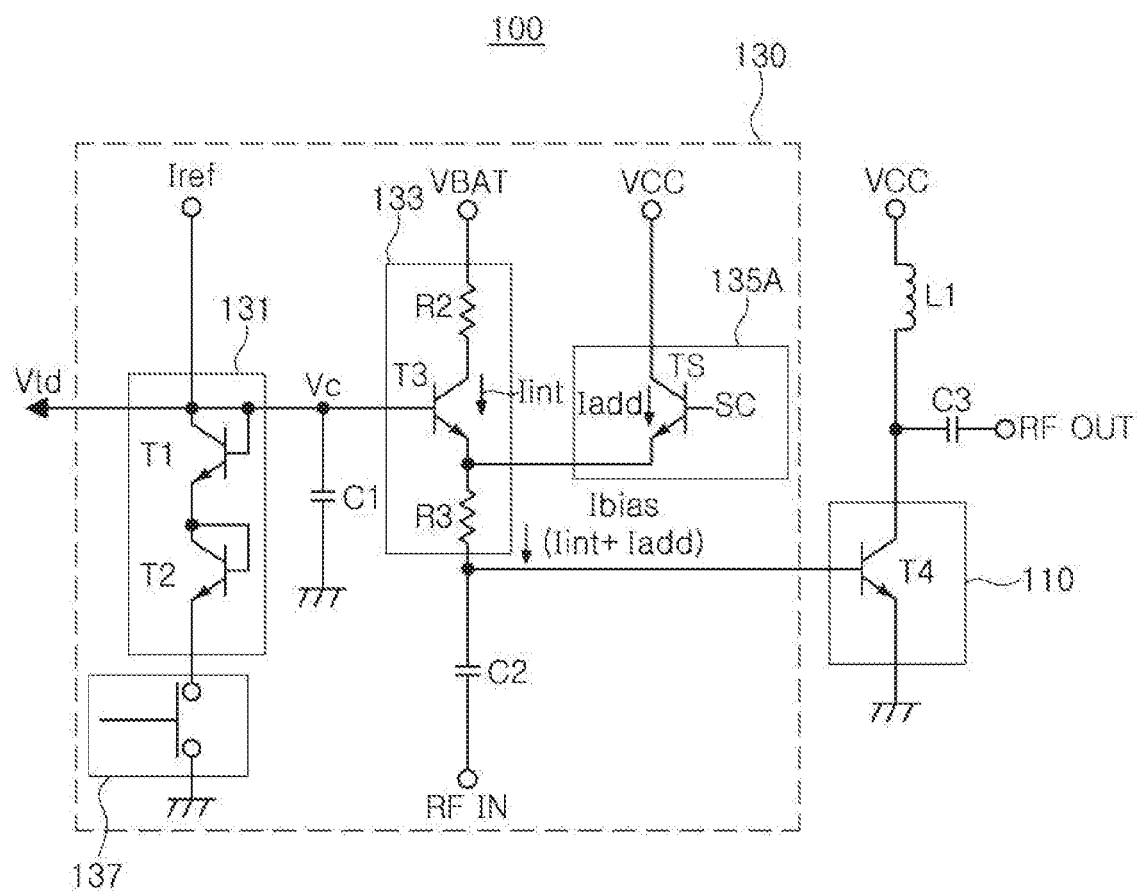
FIG. 7 is a diagram illustrating an example of an amplifying circuit of FIG. 1.

FIG. 7 is a diagram illustrating an example of an amplifying circuit of FIG. 1.

In a non-limiting example, the amplifying circuit 100 illustrated in FIG. 7 may further include a switch 137, in comparison to the amplifying circuit illustrated in FIG. 6.

The switch 137 may be connected between the temperature detection circuit 131 and a ground, and may be turned off during the initial driving.

As such, in an example in which the switch 137 is turned off during the initial driving, a current flowing to the ground through the temperature detection circuit 131 may not flow to the ground but may instead flow through the base of the bias transistor T3. As a result, the internal current and the bias current may increase accordingly.

Figure 8:
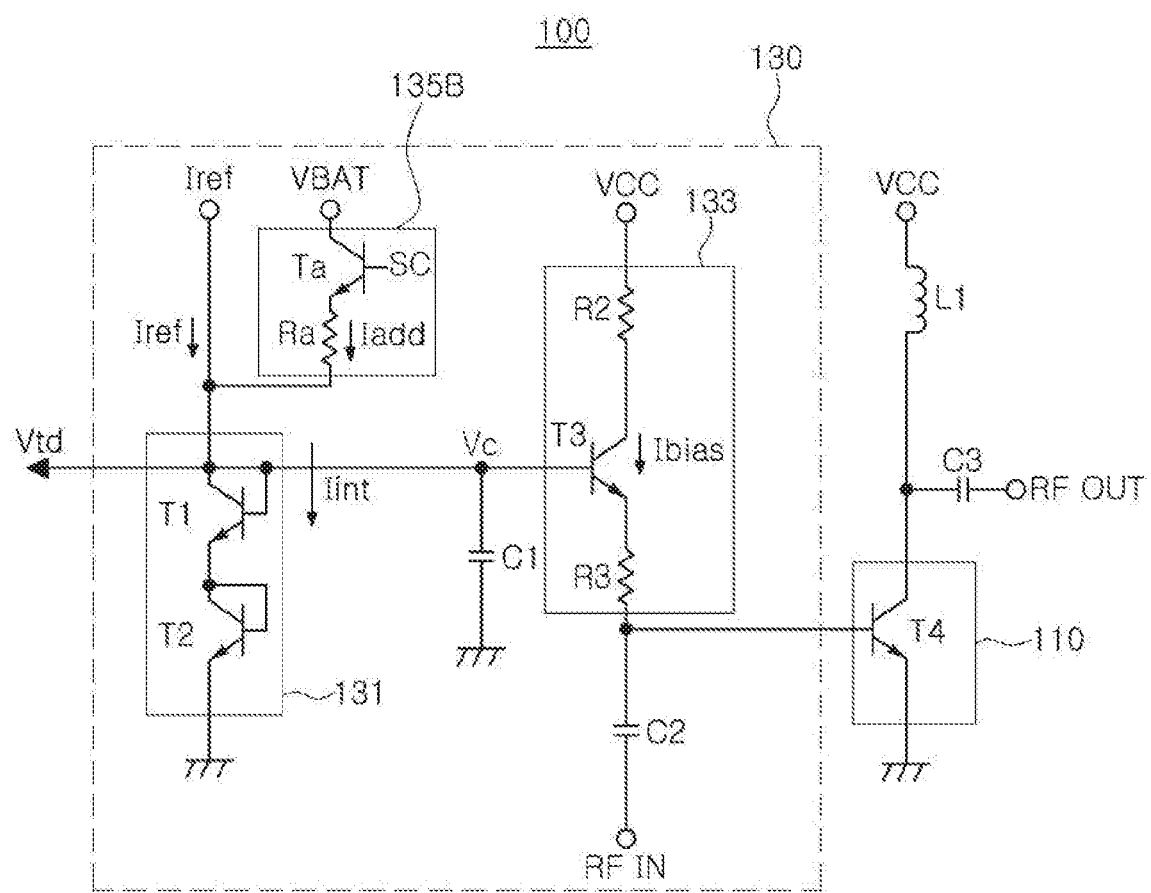
FIG. 8 is a diagram illustrating an example of an amplifying circuit of FIG. 1.

FIG. 8 is a diagram illustrating an example of an amplifying circuit of FIG. 1.

Referring to FIG. 8, the amplifying circuit 100 may include the power amplifier 110 and the bias circuit 130.

In a non-limiting example, the bias circuit 130 may include a current addition circuit 135B, the temperature detection circuit 131, and the current output circuit 133.

The current addition circuit 135B may include a switch transistor Ta and a resistor Ra connected between the battery voltage VBAT terminal and the temperature detection circuit 131, the switch transistor Ta may be turned on in response to the control signal SC during the initial driving to output an additional current $I_{add}$ generated by the battery voltage VBAT terminal and the resistor Ra to the temperature detection circuit 131.

The temperature detection circuit 131 may include the transistor circuits T1 and T2 which may be diode-connected to each other in series between the reference current $I_{ref}$ terminal and a ground as illustrated in FIG. 6. The diode-connected transistor circuits T1 and T2 may receive an internal current $I_{int}$ obtained by adding the additional current $I_{add}$ to a reference current $I_{ref}$ during the initial driving to detect an ambient temperature of the power amplifier 110 and generate the temperature detection voltage $V_{td}$. In addition, the diode-connected transistor circuits T1 and T2 may receive the reference current $I_{ref}$ after the initial driving. The internal current $I_{int}$ during the initial driving may be larger than the reference current Iint by the additional current $I_{add}$.

Accordingly, the current output circuit 133 may include, for example, a bias transistor T3 including a base receiving the temperature detection voltage $V_{td}$ from the diode-connected transistor circuits T1 and T2, a collector connected to the power supply voltage VCC terminal through the resistor R2, and an emitter supplying a bias current to a signal line through the bias resistor R3. The bias transistor T3 may generate a relatively large bias current $I_{bias}$ during the initial driving on the basis of the temperature detection voltage $V_{td}$ from the temperature detection circuit 131.

Figure 9:
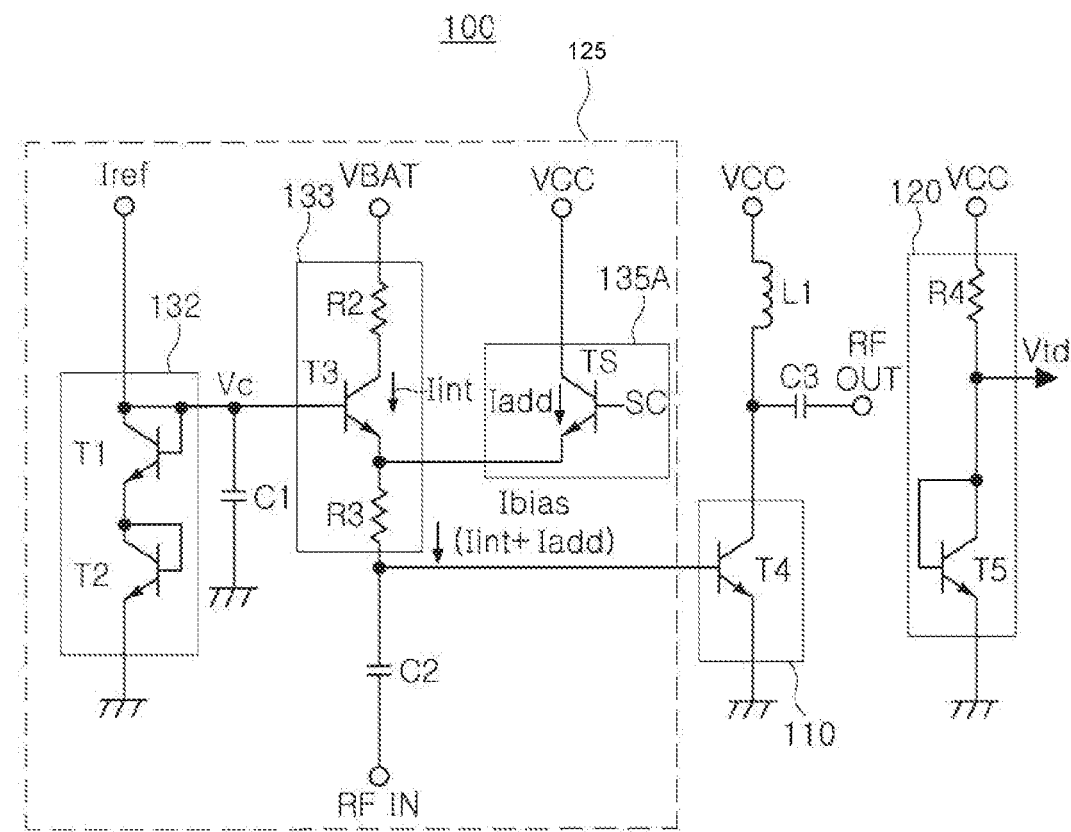
FIG. 9 is a diagram illustrating an example of an amplifying circuit of FIG. 2.

FIG. 9 is a diagram illustrating an example of an amplifying circuit of FIG. 2.

Referring to FIG. 9, the amplifying circuit 100 may include the power amplifier 110, the temperature detection circuit 120, and the bias circuit 125.

In an example, the bias circuit 125 may include a temperature compensation circuit 132, the current output circuit 133, and a current addition circuit 135A.

The temperature compensation circuit 132 may include the transistor circuits T1 and T2 which are diode-connected to each other in series between the reference current $I_{ref}$ terminal and a ground, as illustrated in FIG. 6, and further illustrated in FIG. 9. The diode-connected transistor circuits T1 and T2 may receive the reference current $I_{ref}$ during the initial driving to detect an ambient temperature of the power amplifier 110 and generate the temperature compensation voltage Vc.

The current output circuit 133 may include, for example, a bias transistor T3 including a base which receives the temperature compensation voltage Vc from the diode-connected transistor circuits T1 and T2, a collector connected to the battery voltage VBAT terminal through the resistor R2, and an emitter which supplies a bias current to a signal line through the bias resistor R3. The bias transistor T3 may generate an internal current $I_{int}$ based on a temperature compensation voltage Vc from the temperature compensation circuit 132.

In a non-limiting example, the current addition circuit 135A may include a compensation transistor TS including a collector connected to a power supply voltage VCC terminal, a base receiving the control signal SC, and an emitter connected to the emitter of the bias transistor T3. The compensation transistor TS may be turned on in response to the control signal SC during initial driving to generate an additional current $I_{add}$ and provide the generated additional current $I_{add}$ to the emitter of the bias transistor T3. Accordingly, the additional current $I_{add}$ may be added to the internal current Iint to generate a bias current Ibias.

The additional current $I_{add}$ may be generated in response to the control signal SC during the initial driving, and may be added to the internal current Iint to generate the bias current $I_{bias}$. Accordingly, a relatively large bias current $I_{bias}$ may be generated by the additional current $I_{add}$ during the initial driving.

The temperature detection circuit 120 may include a resistor R4 and a transistor T5 connected in series between an operating voltage VCC terminal and a ground, and, in a non-limiting example, the transistor T5 may be a diode-connected bipolar junction transistor (BJT). The temperature detection circuit 120 may generate the temperature detection voltage $V_{td}$.

Figure 10:
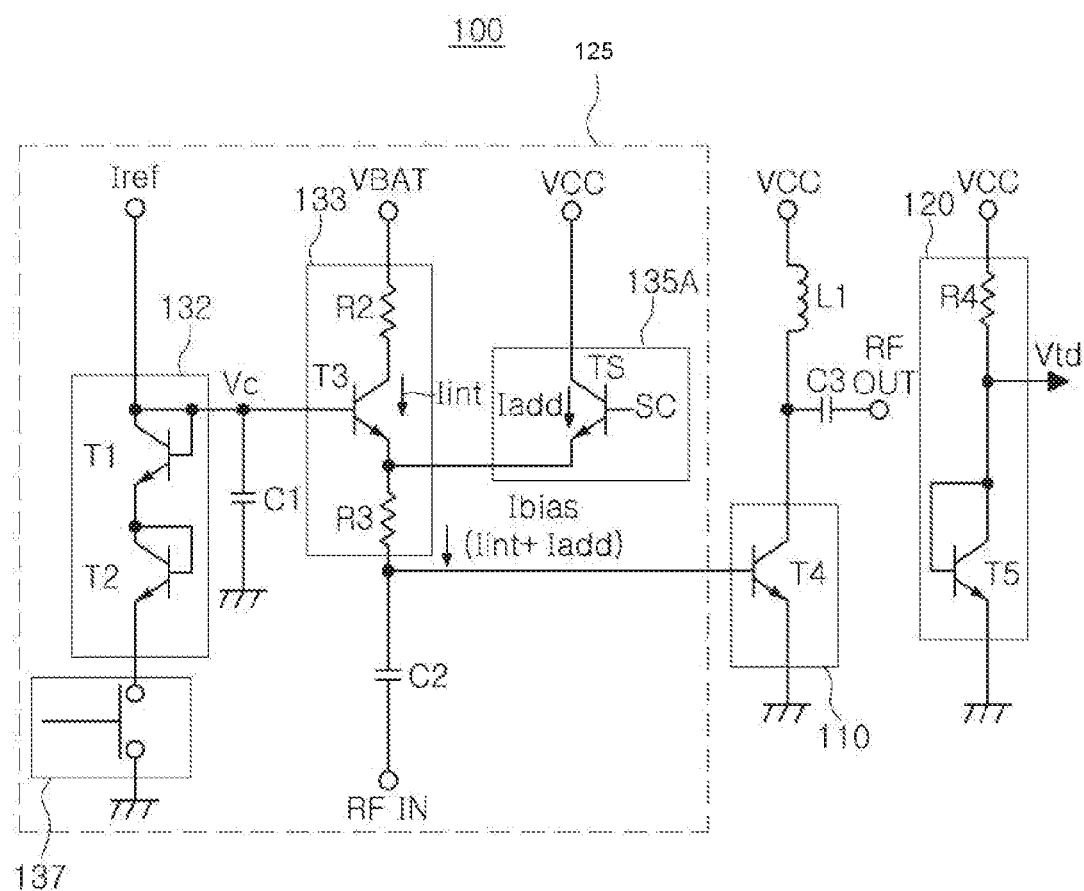
FIG. 10 is a diagram illustrating an example of an amplifying circuit of FIG. 2.

FIG. 10 is an example of a diagram illustrating an amplifying circuit of FIG. 2.

A bias circuit 125 illustrated in FIG. 10 may further include a switch 137, which differs from the bias circuit of FIG. 9.

The switch 137 may be connected between the temperature compensation circuit 132 and a ground, and may be turned off during the initial driving.

Accordingly, in an example in which the switch 137 is turned off during the initial driving, a current flowing to the ground through the temperature compensation circuit 132 may not flow to the ground, but may instead flow through the base of the bias transistor T3. Accordingly, the internal current and the bias current may increase.

Figure 11:
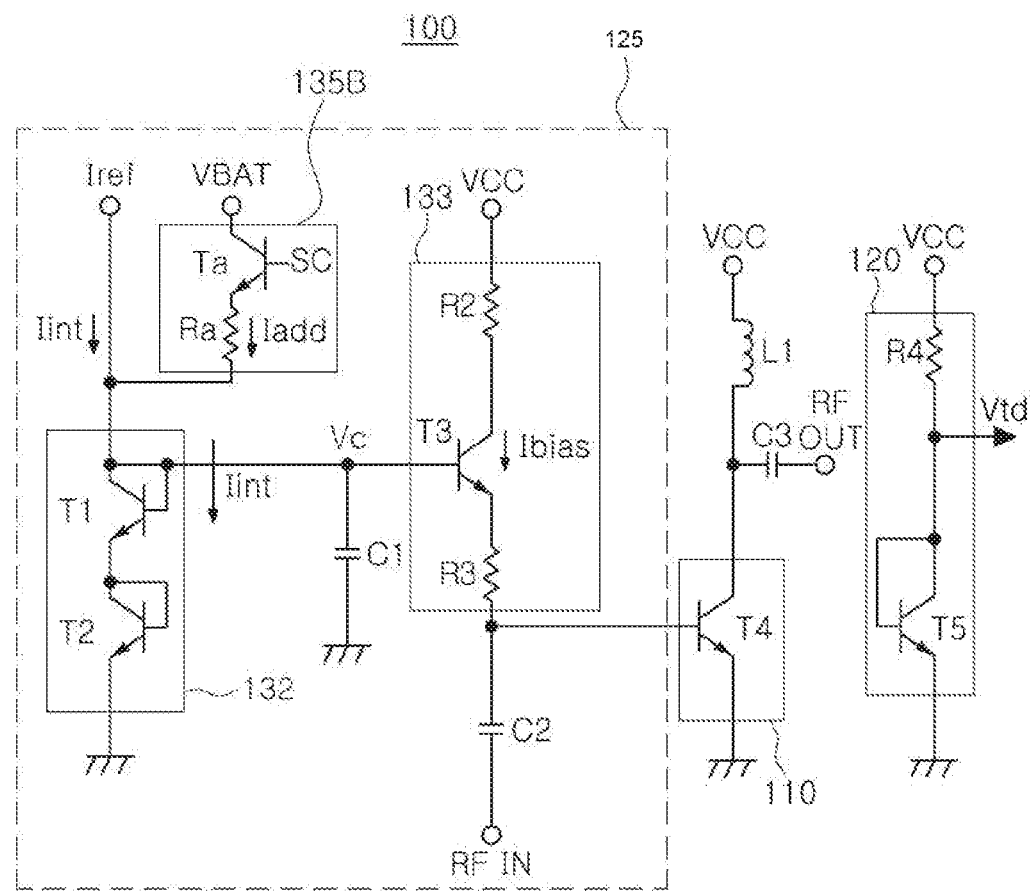
FIG. 11 is a diagram illustrating an example of an amplifying circuit of FIG. 2.

FIG. 11 is an example of a diagram illustrating an amplifying circuit of FIG. 2.

Referring to FIG. 11, the amplifying circuit 100 may include the power amplifier 110, the temperature detection circuit 120, and the bias circuit 125.

In an example, the bias circuit 125 may include a current addition circuit 135B, the temperature compensation circuit 132, and the current output circuit 133.

The current addition circuit 135B may include a switch transistor Ta and a resistor Ra connected between the battery voltage VBAT terminal and the temperature compensation circuit 132. The switch transistor Ta may be turned on in response to the control signal SC during the initial driving to generate an additional current $I_{add}$ generated by the battery voltage VBAT terminal and the resistor Ra and output the generated additional current $I_{add}$ to the temperature compensation circuit 132.

The temperature compensation circuit 132 may include the transistor circuits T1 and T2 which are diode-connected to each other in series between the reference current $I_{ref}$ terminal and a ground as illustrated in FIG. 6, and as further illustrated in FIG. 11. The diode-connected transistor circuits T1 and T2 may generate a temperature compensation voltage Vc according to the internal current Iint obtained by adding the additional current $I_{add}$ to the reference current $I_{ref}$ during the initial driving.

The current output circuit 133 may generate a bias current $I_{bias}$ on the basis of the temperature compensation voltage Vc from the temperature compensation circuit 132.

Accordingly, a relatively large bias current $I_{bias}$ may be generated by the additional current $I_{add}$ during the initial driving.

Figure 12:
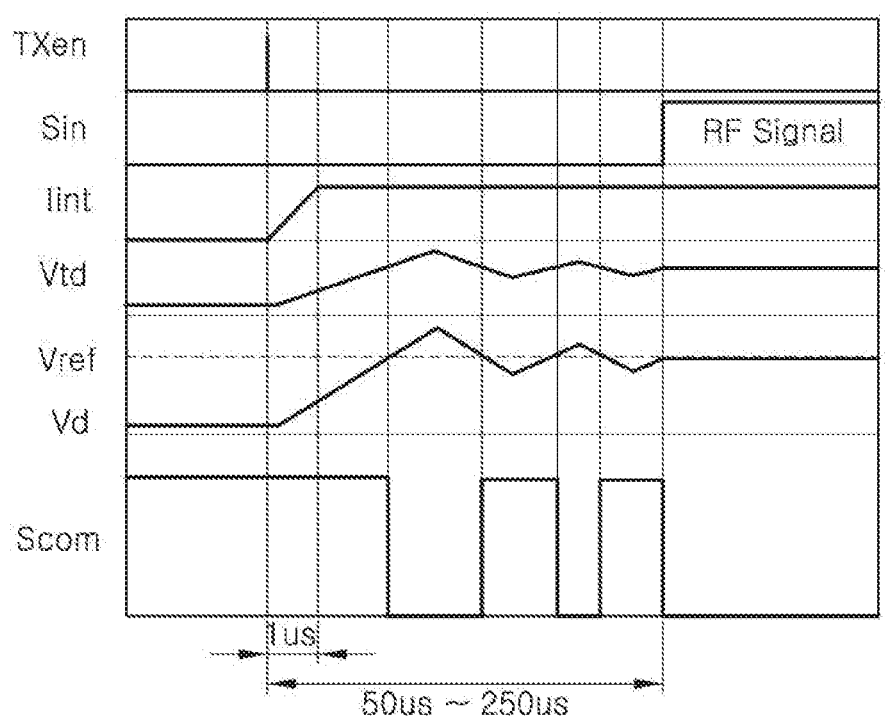
FIG. 12 is an example of a timing chart of main signals of an amplifying apparatus and a temperature control circuit of FIGS. 1 and 3.

FIG. 12 is a timing chart of main signals of the amplifying apparatus and the temperature control circuit of FIGS. 1 and 3.

Referring to FIGS. 1, 2, and 12, $TX_{en}$ indicates a transmission mode enable signal, which may have a high level at the transmission mode starting point in time. $S_{in}$ indicates an input signal. $I_{int}$ indicates an internal current of the bias circuit 125. $V_{dt}$ indicates a temperature voltage output from the temperature detection circuit 131 or 120 to the temperature control circuit 200. $V_{ref}$ indicates a reference voltage input to the comparison circuit 220. $V_d$ indicates a detection voltage output from the temperature voltage converter 210 to the comparison circuit 220. $S_{com}$ indicates a comparison signal output from the comparison circuit 220.

In FIG. 12, the transmission mode enable signal $TX_{en}$ may have a high level at the transmission mode starting point in time which means a point in time at which the initial driving starts. The input signal $S_{in}$ may not be input until a predetermined time elapses from the transmission mode starting point in time and may be input after the predetermined time elapses (for example, approximately 50 to 250 μsec). The internal current Iint may be generated within about 1 μsec from the transmission mode starting point in time. The temperature voltage $V_{dt}$ is a voltage which means an ambient temperature of the power amplifier 110, and the ambient temperature of the power amplifier may be gradually increased according to the bias current supplied to the power amplifier 110, and an increase and a decrease in the ambient temperature of the power amplifier may be repeated. The reference voltage $V_{ref}$ is a voltage of which a magnitude is constant regardless of a change in temperature. The detection voltage $V_d$ is a voltage obtained by amplifying the temperature voltage $V_{td}$. Further, the comparison signal $S_{com}$ may be a pulse width modulation (PWM) signal which has a high level when the reference voltage $V_{ref}$ is higher than the detection voltage $V_d$ as a result of comparing the detection voltage $V_d$ and the reference voltage $V_{ref}$ with each other, and has a low level when the reference voltage $V_{ref}$ is lower than the detection voltage $V_d$.

As set forth above, according to the examples in the present disclosure, dynamic EVM (DEVM) may be reduced by implementing the power amplifier to rapidly reach a saturation state once the transmission mode starts.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An amplifying apparatus comprising:
   an amplifying circuit comprising a power amplifier, a bias circuit, and a temperature control circuit, wherein the bias circuit is configured to:
   detect an ambient temperature of the power amplifier;
   output a temperature voltage based on the detection of the ambient temperature;
   regulate an internal current based on a control signal, and
   supply a bias current obtained by the regulation of the internal current to the power amplifier; and
   the temperature control circuit is configured to generate the control signal based on the temperature voltage during an initial driving from a transmission mode starting point in time to an input point in time at which an input signal is input, and outputting the control signal to the amplifying circuit,
   wherein the temperature control circuit comprises a temperature voltage converter configured to convert the temperature voltage into a detection voltage.

2. The apparatus of claim 1, wherein the bias circuit comprises a temperature detection circuit configured to detect the ambient temperature of the power amplifier to output the temperature voltage.

3. The apparatus of claim 2, wherein the temperature control circuit further comprises:
   a comparison circuit configured to compare the detection voltage and a reference voltage with each other and output a comparison signal that has a level that is based on a result of the comparison,
   a signal detection circuit configured to detect an intensity of the input signal and output a detection signal, and
   a control output circuit configured to generate the control signal based on the detection signal and the comparison signal.

4. The apparatus of claim 3, wherein the control output circuit comprises a logic circuit configured to generate the control signal by performing a logic operation on the detection signal and the comparison signal.

5. The apparatus of claim 3, wherein the control output circuit comprises a switching circuit that is configured to turn on or turn off based on the detection signal, and provide the comparison signal as the control signal when the switching circuit is turned on.

6. The apparatus of claim 3, wherein the bias circuit comprises:
   the temperature detection circuit comprising a transistor circuit configured to receive a reference current to detect the ambient temperature of the power amplifier and generate a temperature detection voltage,
   a current output circuit configured to generate an internal current based on the temperature detection voltage, and
   a current addition circuit configured to generate an additional current based on the control signal during the initial driving, and generate the bias current by adding the additional current to the internal current.

7. The apparatus of claim 6, wherein the bias circuit further comprises a switch that is connected between the temperature detection circuit and a ground, and is configured to turn off during the initial driving.

8. The apparatus of claim 3, wherein the bias circuit comprises:
   a current addition circuit configured to generate an additional current in based on the control signal during the initial driving and add the additional current to a reference current,
   the temperature detection circuit comprising a transistor circuit configured to receive the internal current to detect the ambient temperature of the power amplifier, and generate a temperature detection voltage, and
   a current output circuit configured to generate a bias current based on the temperature detection voltage.

9. An amplifying apparatus comprising:
   an amplifying circuit comprising a power amplifier, a temperature detection circuit, and a bias circuit, wherein the temperature detection circuit is configured to detect an ambient temperature of the power amplifier to output a temperature voltage, and the bias circuit is configured to regulate an internal current based on a control signal to supply a bias current obtained by the regulation to the power amplifier; and
   a temperature control circuit configured to generate the control signal based on the temperature voltage during an initial driving from a transmission mode starting point in time to an input point in time at which an input signal is input, and output the control signal to the amplifying circuit,
   wherein the temperature control circuit comprises a temperature voltage converter configured to convert the temperature voltage into a detection voltage, and a comparison circuit configured to compare the detection voltage and a reference voltage with each other and output a comparison signal that has a level that is based on a result of the comparison result.

10. The apparatus of claim 9, wherein the temperature control circuit further comprises:
    a signal detection circuit configured to detect an intensity of the input signal and output a detection signal, and
    a control output circuit configured to generate the control signal based on the detection signal and the comparison signal.

11. The apparatus of claim 10, wherein the control output circuit comprises a logic circuit configured to generate the control signal by performing a logic operation on the detection signal and the comparison signal.

12. The apparatus of claim 10, wherein the control output circuit comprises a switching circuit configured to turn on or turn off based on the detection signal and provide the comparison signal as the control signal when the switching circuit is turned on.

13. The apparatus of claim 10, wherein the temperature detection circuit comprises a resistor and a transistor connected to each other in series between an operating voltage terminal and a ground, and the transistor is a diode-connected bipolar junction transistor (BJT).

14. The apparatus of claim 13, wherein the bias circuit comprises:
   a temperature compensation circuit configured to generate a temperature compensation voltage based on a reference current,
   a current output circuit configured to generate an internal current based on the temperature compensation voltage, and
   a current addition circuit configured to generate an additional current based on the control signal during the initial driving, and generate the bias current by adding the additional current to the internal current.

15. The apparatus of claim 13, wherein the bias circuit further includes a switch connected between the temperature compensation circuit and a ground and configured to turn off during the initial driving.

16. The apparatus of claim 13, wherein the bias circuit comprises:
   a current addition circuit configured to generate an additional current based on the control signal during the initial driving, and generate an internal current by adding the additional current to a reference current,
   a temperature compensation circuit configured to generate a temperature compensation voltage based on the internal current, and
   a current output circuit configured to generate a bias current based on the temperature compensation voltage from the temperature compensation circuit.

* * * * *